Figure 2A:
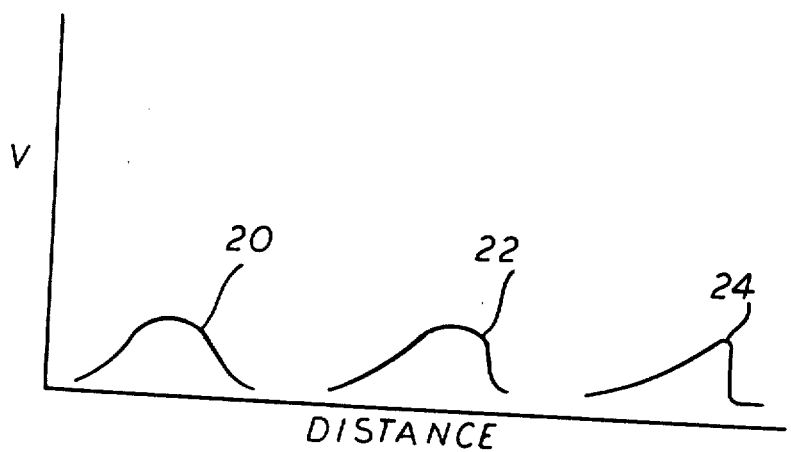

United States Patent [19]

Ikezi et al.

[11] Patent Number: 4,719,429

[45] Date of Patent: Jan. 12, 1988

[54] TRANSMISSION LINE MICROWAVE GENERATOR

[75] Inventors: Hiroyuki Ikezi, Rancho Santa Fe; Torkil H. Jensen, Del Mar, both of Calif.

[73] Assignee: GA Technologies Inc., San Diego, Calif.

[21] Appl. No.: 851,977

[22] Filed: Apr. 14, 1986

[51] Int. Cl.[4] .......................... H03K 3/01; H03K 3/53; H03K 3/86
[52] U.S. Cl. ........................... 328/65; 328/67; 333/20; 333/238
[58] Field of Search ............... 328/65, 67, 74; 333/20, 333/161, 238

[56] References Cited

U.S. PATENT DOCUMENTS

| 3,388,287 | 6/1968 | Keenan | 328/65 |
| 3,484,619 | 12/1969 | Proud, Jr. | 333/20 |
| 3,514,704 | 5/1970 | Penney, Jr. | 328/67 |
| 4,114,051 | 9/1978 | Curtice | 328/65 |
| 4,176,285 | 11/1979 | Norris | 328/65 |

OTHER PUBLICATIONS

*Solitons in Action*, pp. 1–5 and 127–152 (K. Lonngren and A. Scott ed. 1978).

*Primary Examiner*—John Zazworsky
*Attorney, Agent, or Firm*—Fitch, Even, Tabin & Flannery

[57] ABSTRACT

The present invention is a device for generating high power microwave pulses using a nonlinear dispersive transmission line connected by a switch means to a source cable means and a high voltage source. The closing of the switch means sends an electrical pulse propagating from the source cable means through the transmission line. The pulse decomposes into a short, high power pulse of microwaves which consists of an array of solitons. The output of the line may be coupled into an antenna, wave guide or other load.

8 Claims, 8 Drawing Figures

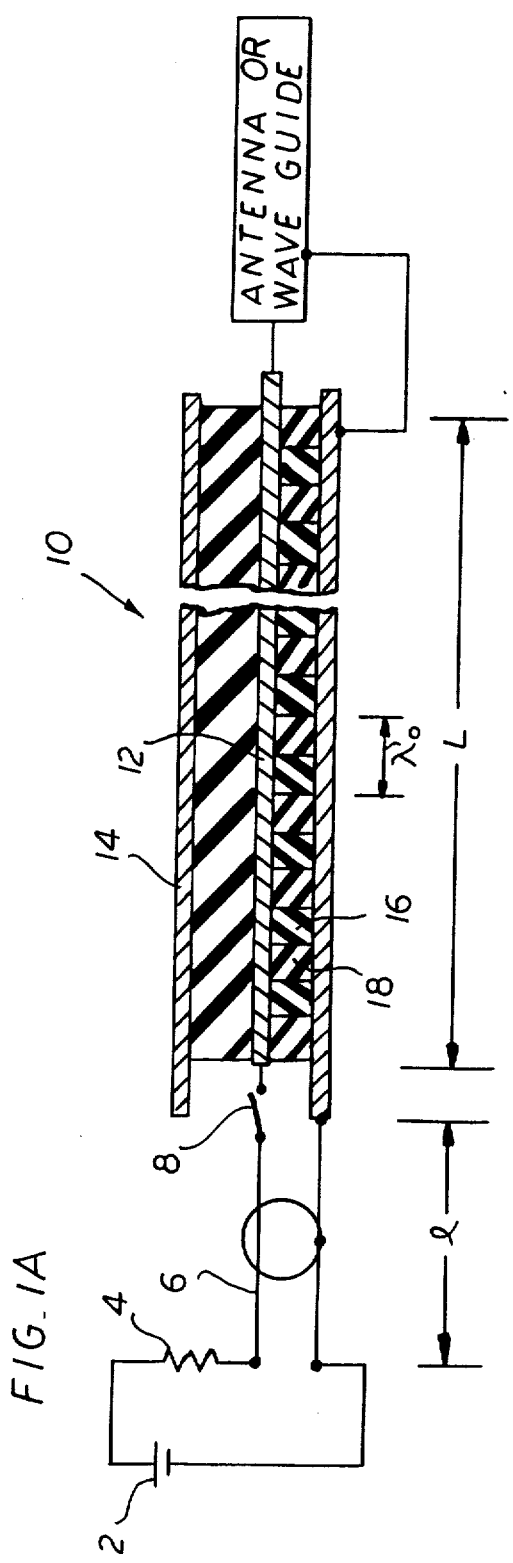
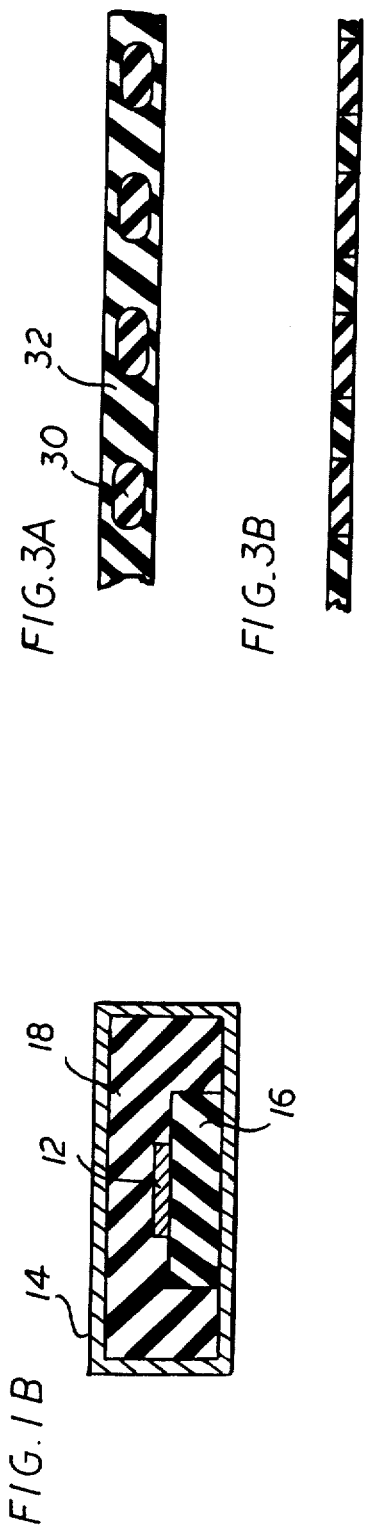

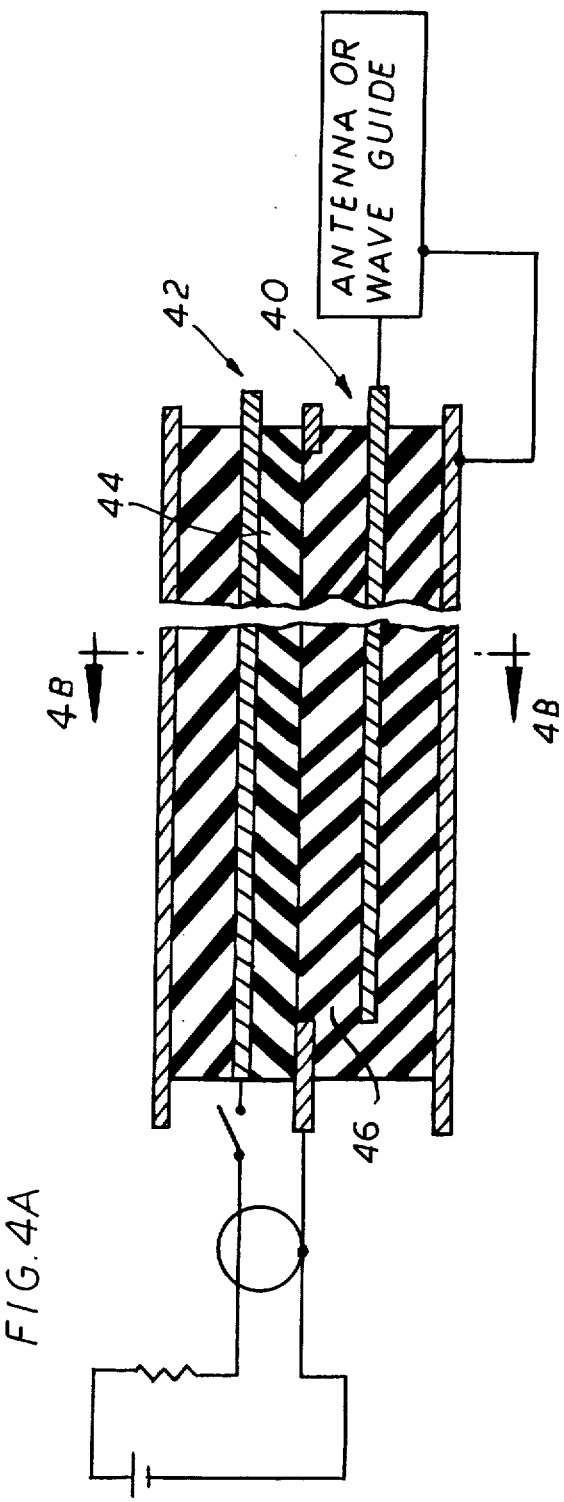
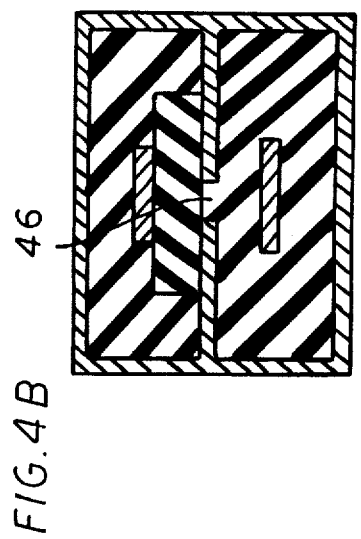

TRANSMISSION LINE MICROWAVE GENERATOR

This invention relates to microwave generators and in particular to transmission line microwave generators for generating high power microwave pulses.

BACKGROUND OF THE INVENTION

There has been a significant amount of theoretical and experimental work on solitons in nonlinear dispersive media. See for example K. E. Lonngren, Solitons In Action, Academic Press (1978). Others have proposed the use of transmission lines for the generation of high peak power microwaves. See Driver et al., U.S. Pat. No. 4,176,295 High Peak Power Microwave Generator Using Light Activated Switches.

SUMMARY OF THE INVENTION

The present invention is a device for generating high power microwave pulses using a nonlinear dispersive transmission line connected by a switch means to a source cable means and a high voltage source. The closing of the switch means sends an electrical pulse propagating from the source cable means through the transmission line. This pulse decomposes into a short, high power pulse of microwaves which consists of an array of solitons. The output of the line may be coupled into an antenna, wave guide or other load.

PREFERRED EMBODIMENT OF THE INVENTION

A preferred embodiment of the present invention can be described by reference to FIGS. 1A and 1B. A high voltage source 2 is connected through a resistor 4 to a source cable 6 which in turn is connected through a switch 8 to a nonlinear dispersive transmission line 10. The transmission line is comprised of inner conductor 12 and outer conductor 14. Inner conductor 12 is separated on one side from the outer conductor by alternating sections of an insulator having field dependent permittivity 16 and a conventional insulator 18. The distance $\lambda_o$ between the leading edge of one insulator 16 and the leading edge of the next succeeding insulator 16 as shown in FIG. 1A defines a modulation wave of the length (commonly represented as $\lambda_m$) $\lambda_m$ of the transmission line. The voltage source 2 is a direct current source. Source cable 6 is a transmission line having a characteristic impedance matched to the impedance of transmission line 10. Cable 6 is charged through resistor 4. Switch 8 is a pressurized gap switch or liquid filled switch having a triggering electrode and a rise time of less than microwave pulse width to be generated.

An example of an embodiment designed for generating 3 GHz microwave pulses containing about 10 oscillations has the following characteristics: The length, L, of the transmission line 10 is 2 meters. Variable permittivity insulator 16 is comprised of $SrTiO_3$ crystal and the conventional insulator is any low loss tangent material such as teflon. The inner conductor 12 is an elongated flat copper plate and the outer conductor 14 is a rectangular copper tube. The modulation wavelength $\lambda_m$ is 0.64 cm. $L\lambda_m$ therefore is 310. The thickness of insulator 16 is 1 mm; therefore, the field strength $E=V/2d=500,000$ volts/cm when the source cable is charged up to 100 kv. The length of source cable 6 is 0.3 meters giving a pulse width of 3 ns.

Operation

The operation of the microwave generator will now be discussed by reference to FIGS. 1A and 1B and FIGS. 2A and 2B.

Figure 2B:
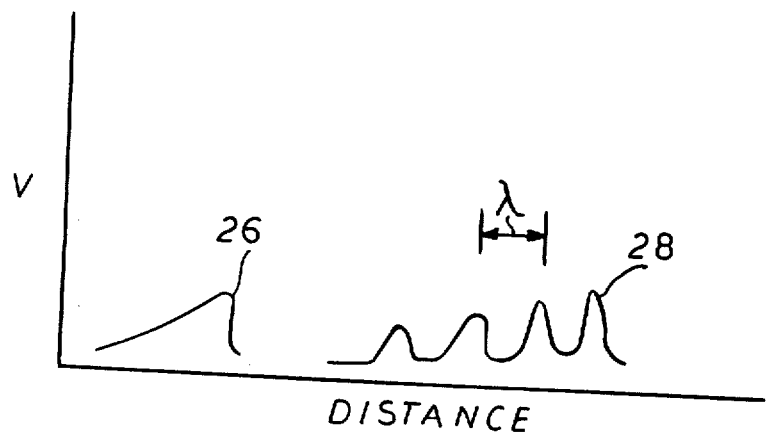

The voltage source 2 charges the source cable 6 through resistor 4. Switch 8 is then triggered and closed. This sends a pulse 20 traveling down transmission line 10 as shown in FIG. 2A. The permittivity of $SrTiO_3$ is lower for high voltage than for low voltage. As a result, the large amplitude part of pulse 20 propagates faster than the low amplitude part. As a result the signal steepens to shapes 22 and 24 as shown in FIG. 2A and shape 26 as shown in FIG. 2B. The periodic discreteness resulting from alternate sections of $SrTiO_3$ and teflon as shown in FIG. 1A introduces a dispersive character to transmission line 10. This results in the leading edge of pulse 26 breaking into a wave train and since the dissipation of the transmission line is small, the entire pulse decomposes into an oscillating signal 28 as shown in FIG. 2B. The wave length of the oscillations $\lambda$ of pulse 28 is a few times the modulation wave length $\lambda_m$. The output of the microwave is coupled into an antenna, wave guide or other appropriate load.

The power of the microwave pulse can be made quite high. For example, if the source cable has a characteristic impedance of $Z_o=1$ ohm and is charged to a potential of 100 KV, then the power of the pulse $(V_o/2)^2/Z_o$ is $2.5\times10^9$ W. About one-third of the power is converted into microwaves so that the microwave output is 0.8 GW.

ALTERNATIVE DESIGNS

If dispersion is not built into the line, the steepened wave becomes stationary like a shock wave, i.e., the generation of the high frequency component stops. Periodic modulation of the line such as shown in FIG. 1A carries the high frequency component away from the steepened wave front (i.e. disperses the high frequency component), thus the oscillatory waveform develops. Another way to achieve periodic modulation is shown in FIGS. 3A and 3B. These figures show cross sections of a transmission line insulator demonstrating another method of spacing an insulator having field dependent permittivity 30 such as $SrTiO_3$ and a conventional insulator 32 such as teflon in order to achieve nonlinearity and dispersion in a transmission line.

A method of disbursing the high frequency component away from the steepened wave without periodic spacial modulation can be described by reference to FIGS. 4A and 4B. We put second transmission line 40 side-by-side with first transmission line 42. First line 42 is insulated in part with an insulator having field dependent permittivity 44 in this case $SrTiO_3$. It is similar to line 10 shown in FIG. 1A except the $SrTiO_3$ is a continuous strip on the bottom of the line. A pulse similar to pulse 26 in FIG. 2B is generated in first line 42 but the pulse does not disperse in line 42. Line 42, however, is coupled continuously in space with line 40. The coupling in this case is made through a continuous slit 46 in the portion of the outside conductor 48 which is common to both lines. The phase velocity of the one line is slightly different from the phase velocity of the other line due, in this embodiment, to the presence of the $SrTiO_3$ strip. Therefore, when the high frequency component at the steepened pulse such as pulse 26 in FIG. 2B couples into the transmission line 40, it disperses into an oscillating signal such as signal 28 in FIG. 2B. Another version of this embodiment utilizes periodic coupling holes in the common conductor in lieu of the continuous slit.

It will be understood that various changes in details, materials, arrangements of parts and operating conditions which have been described and illustrated in order to explain the nature of the invention may be made by those skilled in the art within the principals and scope of this invention. For example, one such variation would be to replace the field dependent dielectric material by a magnetic insulator having magnetic permeability which depends on the magnetic field strength.

What is claimed is:

1. A microwave generator for receiving high energy input pulses and for dispersing said high energy pulses so as to generate high power microwave pulses in a first direction, comprising an outer conductor extending in said first direction defining an enclosed volume, an inner conductor within said outer conductor and spaced therefrom, means for receiving high energy input pulses and for connecting high energy input pulses to said inner and said outer conductors, first and second insulator materials disposed in respective first and second portions of said enclosed volume, said first and second insulator materials providing different propagation rates for said high energy input pulses when said input pulses travel therealong, said second insulator material having a non-linear field-dependent characteristic providing a nonlinear field-dependent propagation rate for portions of said input pulses, so as to selectively disperse said input pulses along said microwave generator.

2. The microwave generator of claim 1 wherein said second insulator material comprises a plurality of discrete insulator portions spaced in said first direction along said enclosed volume.

3. The microwave generator of claim 2 wherein said discrete insulator portions are uniformly spaced along said enclosed volume and have a cross-sectional are smaller than the cross-sectional area of said enclosed volume.

4. The microwave generator of claim 1 wherein said inner and said outer conductors extend along said microwave generator in said first direction and said second insulator material is generally coextensive with said inner and said outer conductors.

5. The microwave generator of claim 4 wherein said outer conductor defines a substantially enclosed interior volume surrounding said inner conductor, and said second material has a cross-sectional area less than the cross-sectional area of said substantially enclosed interior volume.

6. The microwave generator of claim 1 wherein said second insulator material contacts both said inner and said outer conductors.

7. The microwave generator of claim 6 wherein said second insulator material comprises a magnetic insulator having magnetic permeability which depends on the magnetic field strength of a pulse signal being generated along said microwave generator.

8. The microwave generator of claim 6 wherein said second insulator material comprises an electric insulator having electric permittivity which depends on the electric field strength of a signal pulse traveling in said microwave generator.

* * * * *

UNITED STATES PATENT AND TRADEMARK OFFICE
CERTIFICATE OF CORRECTION

PATENT NO. : 4,719,429
DATED : January 12, 1988
INVENTOR(S) : Hiroyuki Ikezi and Torkil H. Jensen It is certified that error appears in the above-identified patent and that said Letters Patent is hereby corrected as shown below:

Column 1, line 46, After "wave" delete "of the",

Column 1, line 47, Delete "$\lambda_m$" (second occurrence),

Column 1, line 64, Change "$L_{\lambda m}$" to --$L/\lambda m$--,

Column 1, line 66, After "length" insert --$\ell$--.

Column 4, line 5, Change "are" to --area--.

Signed and Sealed this

Seventh Day of June, 1988

*Attest:*

*Attesting Officer*

DONALD J. QUIGG

*Commissioner of Patents and Trademarks*